(12) United States Patent
Nishikawa et al.

(10) Patent No.: US 6,680,512 B2
(45) Date of Patent: Jan. 20, 2004

(54) SEMICONDUCTOR DEVICE HAVING AN INTEGRAL PROTECTION CIRCUIT

(75) Inventors: Mutsuo Nishikawa, Nagano (JP); Katsumichi Ueyanagi, Nagano (JP); Katsuyuki Uematsu, Nagano (JP)

(73) Assignee: Fuji Electric Co., Ltd. (JP)

( * ) Notice: Subject to any disclaimer, the term of this patent is extended or adjusted under 35 U.S.C. 154(b) by 84 days.

(21) Appl. No.: 10/121,447

(22) Filed: Apr. 12, 2002

(65) Prior Publication Data

US 2002/0175425 A1 Nov. 28, 2002

(30) Foreign Application Priority Data

Apr. 12, 2001 (JP) ........................................ 2001-114328

(51) Int. Cl.[7] ............................................... H01L 23/62
(52) U.S. Cl. ........................................ 257/355; 257/360
(58) Field of Search ................................ 257/355, 357, 257/360, 361, 358, 368, 369, 494, 603, 536

(56) References Cited

U.S. PATENT DOCUMENTS

2002/0175425 A1 * 11/2002 Nishikawa et al. ......... 257/782

FOREIGN PATENT DOCUMENTS

JP  11-251453  9/1999

* cited by examiner

Primary Examiner—Mark V. Prenty
(74) Attorney, Agent, or Firm—Rossi & Associates

(57) ABSTRACT

A CMOS device with an integral reverse connection protection circuit having a low impedance region, whose impedance becomes lowest when a Vcc pad to which is to be supplied power supply voltage and a GND pad to which is to be supplied ground potential are connected in reverse polarity. The low impedance region, Vcc pad and GND pad are electrically connected through a metal line and a metal line, and current is diverted into the low impedance region during the reverse connection so as to protect an internal circuit. Surge protection elements with identical characteristics are disposed in proximity to three sides or four sides of a pad, and each side of the pad and the surge protection element corresponding thereto are electrically connected to each other, so that surge current applied to the pad is dispersed to the plurality of surge protection elements to protect the internal circuit.

18 Claims, 9 Drawing Sheets

SEMICONDUCTOR DEVICE HAVING AN INTEGRAL PROTECTION CIRCUIT

FIELD OF THE INVENTION

The present invention relates to a semiconductor device that is integrated with a protection circuit that deals with reverse connection or surges in a CMOS integrated circuit.

BACKGROUND OF THE INVENTION

In a semiconductor integrated circuit device for use in electric equipment and electronic equipment for mobile application, medical application, and industrial application, a power supply terminal and a ground terminal for supplying operational voltage to a complimentary metal-oxide semiconductor (CMOS) integrated circuit may be brought into reverse connection by mistake in an assembly process carried out by an automobile manufacturer and an electrical equipment manufacturer. If a reverse voltage is applied between the power supply terminal and the ground terminal due to such reverse connection, a forward voltage is applied to all of metal-oxide semiconductor (MOS) transistors in the CMOS integrated circuit and PN junctions of resistors produced using a substrate. Namely, the entire CMOS integrated circuit becomes similar to a forward-biased diode.

Therefore, current flows everywhere in the CMOS integrated circuit, and this may cause breakdown of the CMOS integrated circuit. For example, the CMOS integrated circuit is shorted by melting at a location where the current density exceeds a device allowable value, or lines are cut by migration. It is therefore necessary to protect the semiconductor integrated circuit device from such reverse connection. Conventionally, to deal with the reverse connection, an external reverse connection protection device is utilized. This protection device is external to the IC chip that includes the CMOS integrated circuit. Alternatively, it has been proposed that a reverse connection protection circuit is provided in an IC chip (e.g. Japanese Laid-Open Patent Publication No. 10-289956).

Further, in order to improve the capability to withstand voltage surges due to static electricity or overvoltage, one or two surge protection elements such as Zener diodes or MOS diodes are connected in proximity to one side or both sides of an input/output pad in a CMOS integrated circuit to prevent voltage surges from entering the internal circuit.

The use of the external reverse connection protection device external to the IC chip as described above, however, will raise the cost due to an increase in the number of parts and the number of assembly steps. Moreover, according to the technique in which the reverse connection protection circuit is integrated in the IC chip as disclosed in the above-mentioned Japanese Laid-Open Patent Publication, the necessity of forming a bipolar transistor requires a special ion implantation process which thus raises the cost of the device.

Further, with further integration of semiconductor integrated circuits in recent years, the width of lines and the distance between lines in the integrated circuits have been reduced due to the minimization required by a design rule, and a surge breakdown voltage has been required to increase. For this reason, providing the surge protection elements at one side or both sides of the input/output pad cannot satisfactorily prevent insulation breakdown of the protection elements.

Therefore, it would be desirable to provide an inexpensive semiconductor device that includes a reverse connection protection circuit that may be fabricated by the CMOS fabrication process. It would further be desirable to provide a semiconductor device that includes a protection circuit having a higher capability to withstand surges as compared with the prior art.

SUMMARY OF THE INVENTION

The present invention provides a semiconductor device which includes a Vcc pad to which should be supplied a power supply voltage, a GND pad to which should be supplied a ground potential, a low impedance region that is formed by a CMOS fabrication process and is designed such that an impedance thereof becomes lowest in a circuit when the ground potential and the power supply voltage are supplied to the Vcc pad and the GND pad, respectively, metal lines that electrically connect the low impedance region to the GND pad and electrically connect the low impedance region with the GND pad. According to the present invention, the low impedance region is fabricated by the CMOS fabrication process, and this eliminates the necessity of a special ion implantation process required for producing a bipolar transistor.

The present invention also provides a semiconductor device which includes surge protection elements with identical characteristics disposed in proximity to three or four sides of a pad, and wherein each side of the pad and the surge protection element corresponding thereto are electrically connected to each other. According to the present invention, the surge current applied to the pad is dispersed to the three or four surge protection elements, and this lowers the density of current flowing through the lines between the pad and the surge protection elements, and reduces the concentration of electric fields between pad peripheral circuit elements and the lines.

BRIEF DESCRIPTION OF THE DRAWINGS

The invention will now be described with reference to certain preferred embodiments thereof and the accompanying drawings, wherein.

DETAILED DESCRIPTION OF THE PREFERRED EMBODIMENTS

Figure 1:
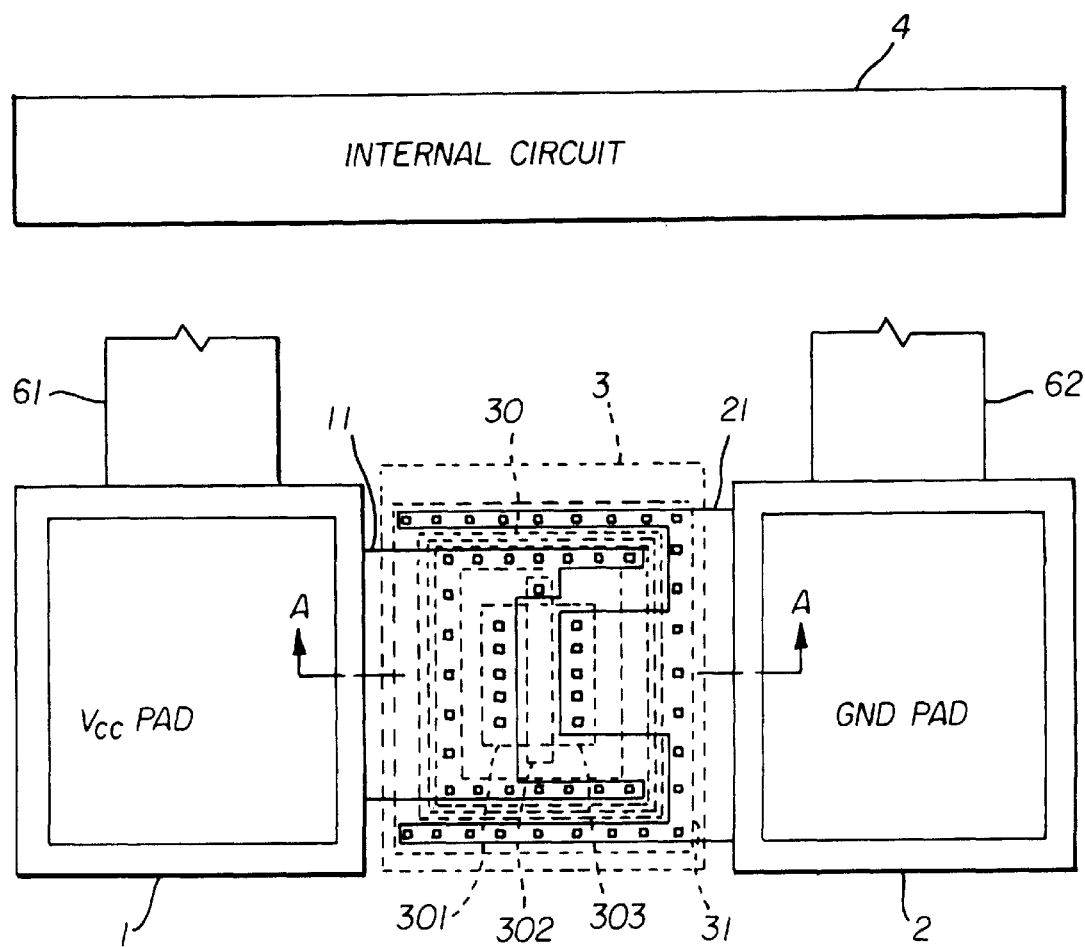
FIG. 1 is a plan view showing a principal part of a semiconductor device according to the first embodiment of the present invention.
Figure 2:
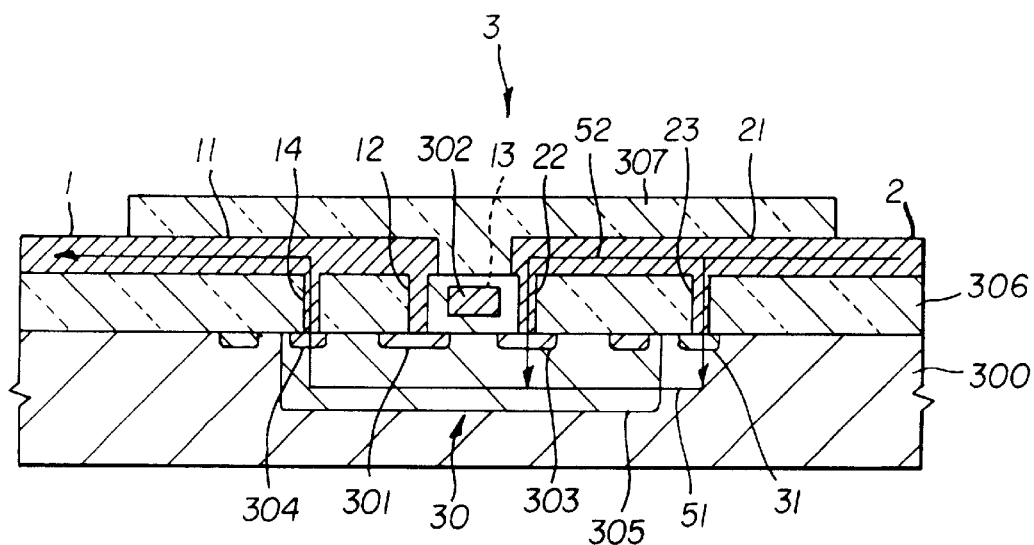
FIG. 2 is a longitudinal sectional view taken along line A—A of FIG. 1.
Figure 3:
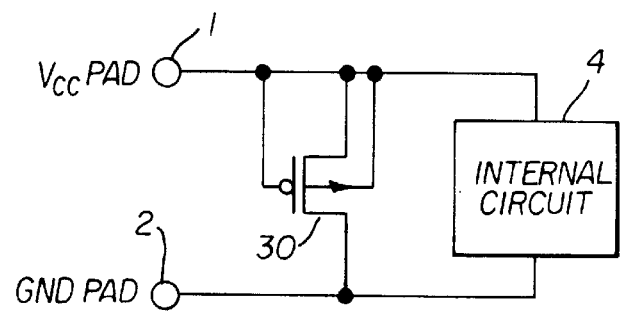
FIG. 3 is a circuit diagram of the semiconductor device in FIG. 1.

Preferred embodiments of the present invention will now be described in detail with reference to the drawings.
First Embodiment:

FIG. 1 is a plan view showing a principal part of a semiconductor device according to the first embodiment of the present invention, FIG. 2 is a longitudinal sectional view taken along line A—A of FIG. 1, and FIG. 3 is a circuit diagram showing the circuit arrangement of the semiconductor device. In FIG. 1, reference numeral 1 denotes a Vcc pad for supplying the power supply voltage to an internal circuit 4 comprised of a CMOS integrated circuit, and reference numeral 2 denotes a GND pad for supplying the ground potential to the internal circuit 4. The semiconductor device is constructed such that a region 3 (hereinafter refered to as "low impedance region"), which is designed so that the impedance can become lowest in an IC chip during reverse connection i.e. when the ground potential is applied to the Vcc pad 1 and the power supply voltage is applied to the GND pad 2, is disposed as a reverse connection protecting element between the Vcc pad 1 and the GND pad 2 and in proximity to the Vcc pad 1 and the GND pad 2. Although not illustrated in the drawings, the Vcc pad 1 and the GND pad 2 are electrically connected to a power supply terminal and a ground terminal, respectively, of the IC chip via bonding wires.

The low impedance region 3 has a p MOS transistor 30 and a $p^+$ guard ring 31 that surrounds the p MOS transistor 30. Therefore, the low impedance region 3 may be fabricated by the CMOS fabrication process. The p MOS transistor 30 is constructed such that a source region 301 and a drain region 303 are formed in an n well 305 formed on a p substrate 300, a gate electrode 302 is formed over the source region 301 and the drain region 303 with a gate insulating film interposed therebetween, metal lines 11, 21 are formed over the gate electrode 302 with an interlayer insulating film 306 interposed therebetween, and the metal lines 11, 21 are coated with a passivation film 307. Note that the passivation film 307 is omitted from FIG. 1.

The source region 301 is electrically connected to the metal line 11 via a contact portion 12. The gate electrode 302 is electrically connected to the metal line 11 via a contact portion 13. The n well 305 is electrically connected to the metal line 11 via a an n well pickup 304 and the contact portion 14. The metal line 11 is electrically connected to the Vcc pad 1. The drain region 303 is electrically connected to the metal line 21 via a contact portion 22. The $p^+$ guard ring 31 is electrically connected to the metal line 21 via a contact portion 23. The metal line 21 is electrically connected to the GND pad 2. The Vcc pad 1 and the GND pad 2 are connected to the internal circuit 4 through a Vcc line 61 and a GND line 62, respectively.

The gate width (W) of the p MOS transistor 30 is larger than that of the MOS transistor of the internal circuit 4. Thus, the p MOS transistor 30 has a larger pn junction area than the MOS transistor of the internal circuit 4, and therefore, the impedance of the low impedance region 3 is lower than that of the internal circuit 4 during reverse connection. It is preferred that the distance between the p MOS transistor 30 and the Vcc pad 1 and the distance between the p MOS transistor 30 and the GND pad 2 are as short as possible in order to lower the resistance of the $p^+$ guard ring 31 and the n well 305.

With the above arrangement, current generated during the reverse connection flows intensively into the low impedance region 3. This reduces current flowing toward the internal circuit 4 to the utmost, and protects the internal circuit 4 from breakdown or the like. The low impedance region 3 and metal lines 11, 21 are designed to have a current density equal to or smaller than an allowable value so as to prevent the p MOS transistor from breaking down and to prevent the metal lines 11, 21 from being cut even if the current generated during the reverse connection flows intensively into the low impedance region 3.

For example, the current density of the p MOS transistor 30 is controlled to be equal to or smaller than an allowable value by increasing the gate width (W) and the pn junction area of the p MOS transistor 30. The width of the metal lines 11, 21 is increased so that the current density of the metal lines 11, 21 can be equal to or smaller than an allowable value. Where the current flowing into the low impedance 3 is represented by "a", the allowable current density of the metal lines 11, 21 is represented by "b", and the film thickness of the metal lines 11, 21 is represented by "c", the minimum wiring width of the metal lines 11, 21 is represented by a/b/c.

Assuming that the current "a", flowing into the low impedance region is 300 mA, the allowable current density "b" of the metal lines 11, 21 is $3 \times 10^5$ A/cm$^2$ (3 mA/$\mu$m$^2$), and the film thickness "c" of the metal lines 11, 21 is 1 $\mu$m, the minimum wiring width will be 100 $\mu$m by calculation of a/b/c. If a safety margin for migration is estimated to be as about three times as large as the wiring width for example, the wiring width should be about 300 $\mu$m. Such a numerical value is only an example, and the minimum wiring width may be calculated by calculation of a/b/c according to the actual specifications and the like of the device.

There will now be described the route of current during reverse connection. The reverse connection causes a junction between the p substrate 300 and the n well 305 and a junction between the drain region 303 and the n well 305 to be forward-biased. As indicated by an arrow in FIG. 2, current flows on a route 51 extending from the GND pad 2 to the Vcc pad 1 via the metal line 21, the $p^+$ guard ring 31, the p substrate 300, the n well 305, the n well pickup 304, and the metal line 11 in this order. Also, current flows on a route 52 extending from the GND pad 2 to the Vcc pad 1 via the metal line 21, the drain region 303, the n well 305, the n well pickup 304, and the metal line 11 in this order.

On this occasion, if a proper voltage is supplied to the Vcc pad 1 and the GND pad 2, the p MOS transistor 30 functions as a surge protection circuit utilizing the punch-through characteristic of the source region 301 and the drain region 303.

According to the above-described first embodiment, the low impedance region 3 is comprised of the p MOS transistor 30, and therefore, the impedance region 3 can be fabricated by the CMOS fabrication process. This eliminates the necessity of a special ion implantation process required for producing a bipolar transistor and thus makes it possible to fabricate a CMOS integrated circuit including a reverse connection protection circuit at a low cost.

Figure 4:
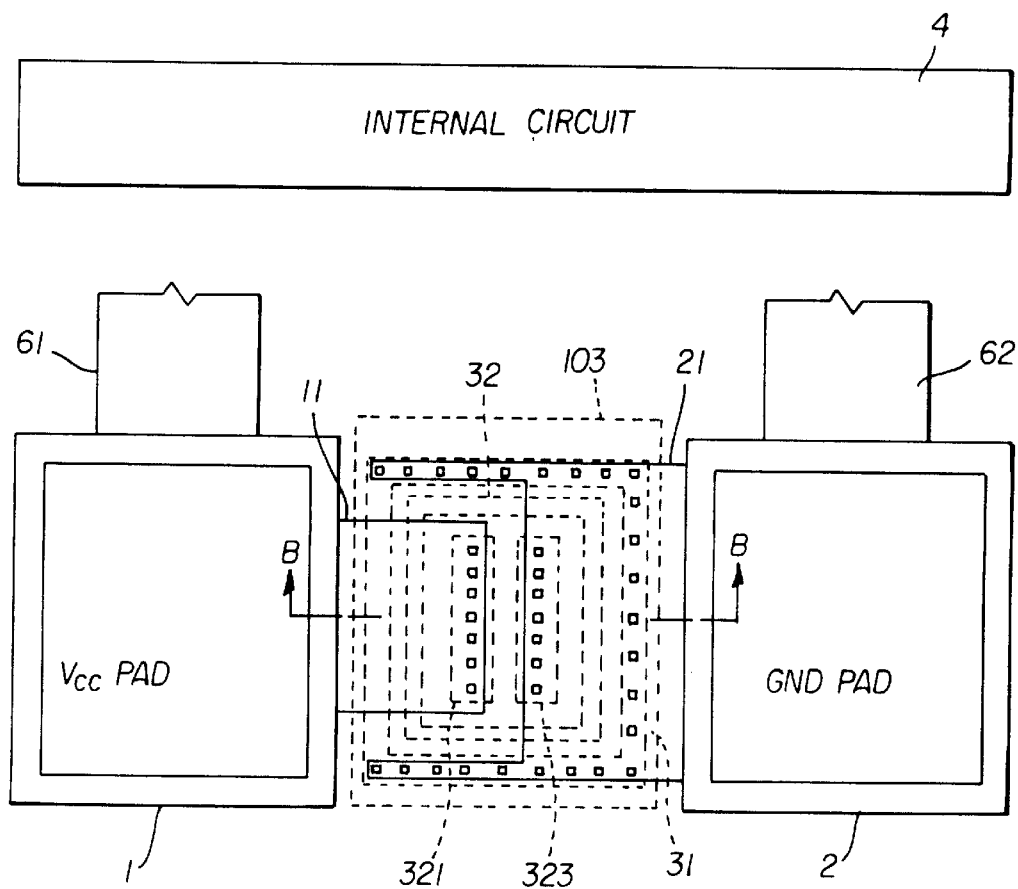
FIG. 4 is a plan view showing a principal part of a semiconductor device according to the second embodiment of the present invention.
Figure 5:
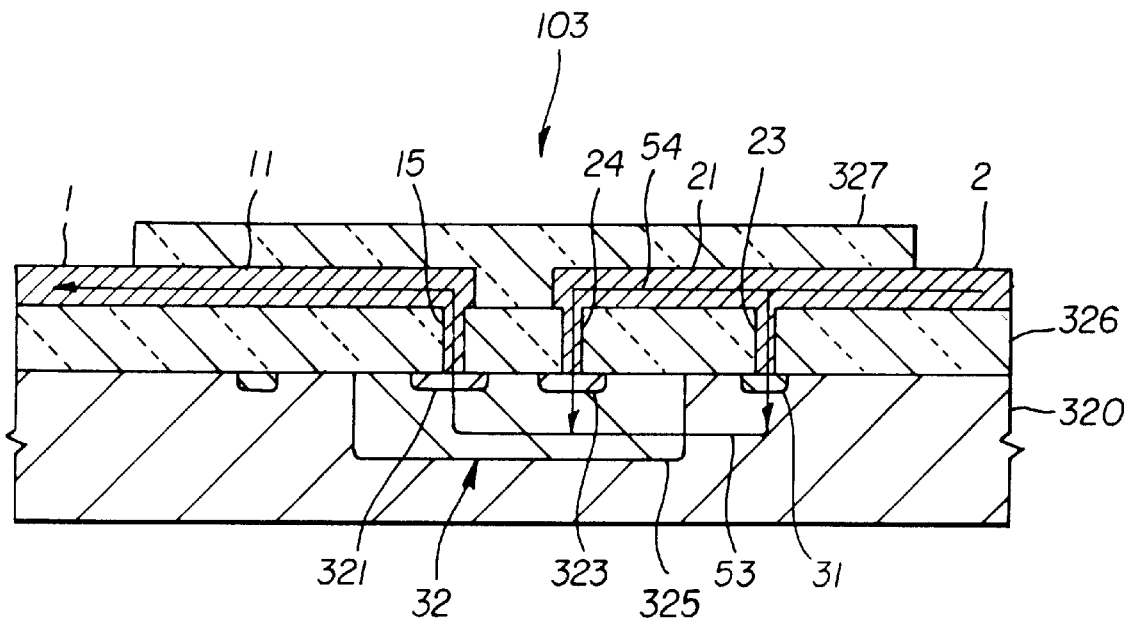
FIG. 5 is a longitudinal sectional view taken along line B—B of FIG. 4.
Figure 6:
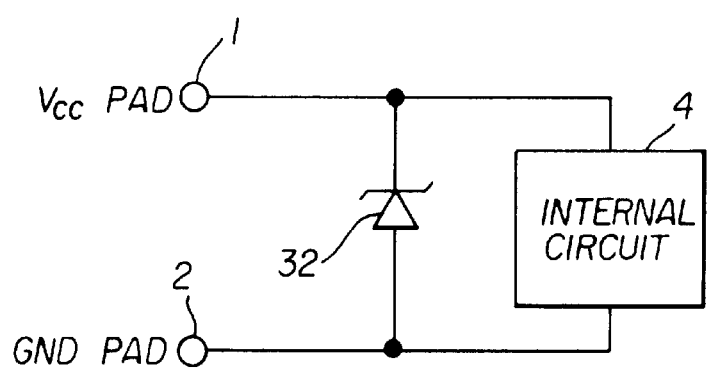
FIG. 6 is a circuit diagram of the semiconductor device in FIG. 4.

Second Embodiment:

FIG. 4 is a plan view showing a principal part of a semiconductor device according to the second embodiment of the present invention, FIG. 5 is a longitudinal sectional view taken along line B—B of FIG. 4, and FIG. 6 is a circuit diagram showing the circuit arrangement of the semiconductor device. The second embodiment is different from the first embodiment in that a low impedance region 103 including a Zener diode 32 is disposed instead of the low impedance region 3 including the p MOS transistor 30 between the Vcc pad 1 and the GND pad 2 and in proximity to the Vcc pad 1 and the GND pad 2. As is the case with the first embodiment, the low impedance region 103 is designed such that the impedance becomes lowest in an IC chip during reverse connection. The other structure of the semiconductor device according to the second embodiment is the same as that of the semiconductor device according to the first embodiment. Therefore, elements and parts of the second embodiment corresponding to those of the first embodiment are denoted by the same reference numerals, and a description thereof is omitted herein.

The low impedance region 103 includes the Zener diode 32, and a p+ guard ring 31 that surrounds the Zener diode 32. The Zener diode 32 may be fabricated by the CMOS fabrication process, and thus, the low impedance region 103 can also be fabricated by the CMOS fabrication process. The Zener diode 32 is constructed such that a cathode region 321 and an anode region 323 are formed in an n− region 325 such as an n well formed on a p substrate 320, metal lines 11, 21 are formed over the cathode region 321 and the anode region 323 with an interlayer insulating film 326 interposed therebetween, and the metal lines 11, 21 are coated with a passivation film 327 (omitted from FIG. 4). A reverse breakdown voltage Vr of the Zener diode 32 depends on a pn junction breakdown voltage of the n− region 325 and the anode region 323.

The cathode region 321 is electrically connected to the metal line 11 via a contact portion 15. The anode region 323 is electrically connected to the metal line 21 via a contact portion 24. The p+ guard ring 31 is electrically connected to the metal line 21 via a contact portion 23.

The anode region 323 and the cathode region 321 are designed to be wide enough to enable the pn junction area in the Zener diode 32 to be larger than the pn junction area in the MOS transistor, etc. of the internal circuit 4 to thereby make the impedance of the low impedance region lower than that of the internal circuit 4. It is preferred that the distance between the Zener diode 32 and the Vcc pad 1 and the distance between the Zener diode 32 and the GND pad 2 are as short as possible in order to lower a value of resistance of the metal line 11 and the metal line 21. It is also preferred that the distance between the p+ guard ring 31 and the n− region 325 is as short as possible so as to lower a value of resistance between them.

With the above arrangement, current generated during the reverse connection flows intensively into the low impedance region 103. This reduces current flowing toward the internal circuit 4 to the utmost, and protects the internal circuit 4 from breakdown and the like. The low impedance region 103 and metal lines 11, 21 are designed such that the current density thereof is equal to or smaller than an allowable value in order to prevent the Zener diode 32 from breaking down and prevent the metal lines 11, 21 from being cut even if the current generated during the reverse connection flows intensively into the low impedance region 103.

For example, the current density of the Zener diode 32 is controlled to be equal to or smaller than an allowable value by increasing the width of the anode region 323 and the cathode region 321 to broaden the pn junction area. The wiring width of the metal lines 11, 21 is increased so that the current density can be equal to or smaller than an allowable value. As is the case with the first embodiment, the minimum wiring width of the metal lines 11, 21 is represented by a/b/c where the current flowing into the low impedance 103 is represented by "a", the allowable current density of the metal lines 11, 21 is represented by "b", and the film thickness of the metal lines 11, 21 is represented by "c".

Assuming that the current "a" flowing into the low impedance region is 300 mA, the allowable current density "b" of the metal lines 11, 21 is $3 \times 10^5$ A/cm$^2$ (3 mA/$\mu$m$^2$), and the film thickness "c" of the metal lines 11, 21 is 1 $\mu$m as is the case with the first embodiment, the minimum wiring width of the metal lines 11, 21 will be 100 $\mu$m by calculation of a/b/c. If a safety margin for migration is estimated to be as about three times as large as the wiring width for example, the wiring width should be about 300 $\mu$m. Actually, the minimum wiring width is found by calculation of a/b/c according to the specifications and the like of the device.

There will now be described the route of current during reverse connection. The reverse connection causes a junction between the p substrate 320 and the n− region 325 and a junction between the cathode region 323 and the n− region 325 to be forward-biased. As indicated by an arrow in FIG. 5, current flows on a route 53 extending from the GND pad 2 to the Vcc pad 1 via the metal line 21, the p+ guard ring 31, the p substrate 320, the n− region 325, the cathode region 321, and the metal line 11 in this order. Also, current flows on a route 54 extending from the GND pad 2 to the Vcc pad 1 via the metal line 21, the anode region 323, the n− region 325, the cathode region 321, and the metal line 11 in this order.

On this occasion, if a proper voltage is supplied to the Vcc pad 1 and the GND pad 2, the Zener diode 32 functions as a surge protection circuit utilizing the reverse breakdown characteristic thereof.

According to the above-described second embodiment, the low impedance region 103 is comprised of the Zener diode 32 that is fabricated by the CMOS fabrication process, and therefore, the low impedance region 103 can be fabricated by the CMOS fabrication process of the device. This eliminates the necessity of a special ion implantation process required for producing a bipolar transistor and thus makes it possible to fabricate a CMOS integrated circuit including a reverse connection protection circuit at a low cost.

Figure 7:
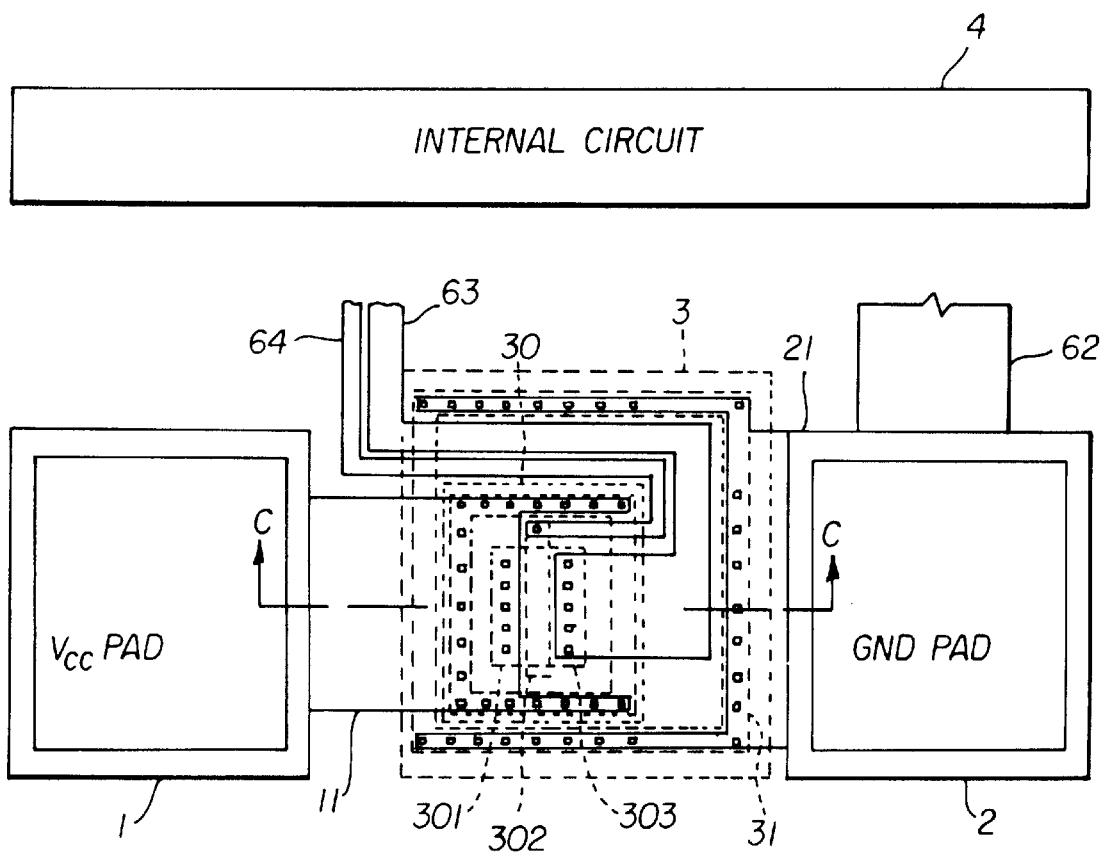
FIG. 7 is a plan view showing a principal part of a semiconductor device according to the third embodiment of the present invention.
Figure 8:
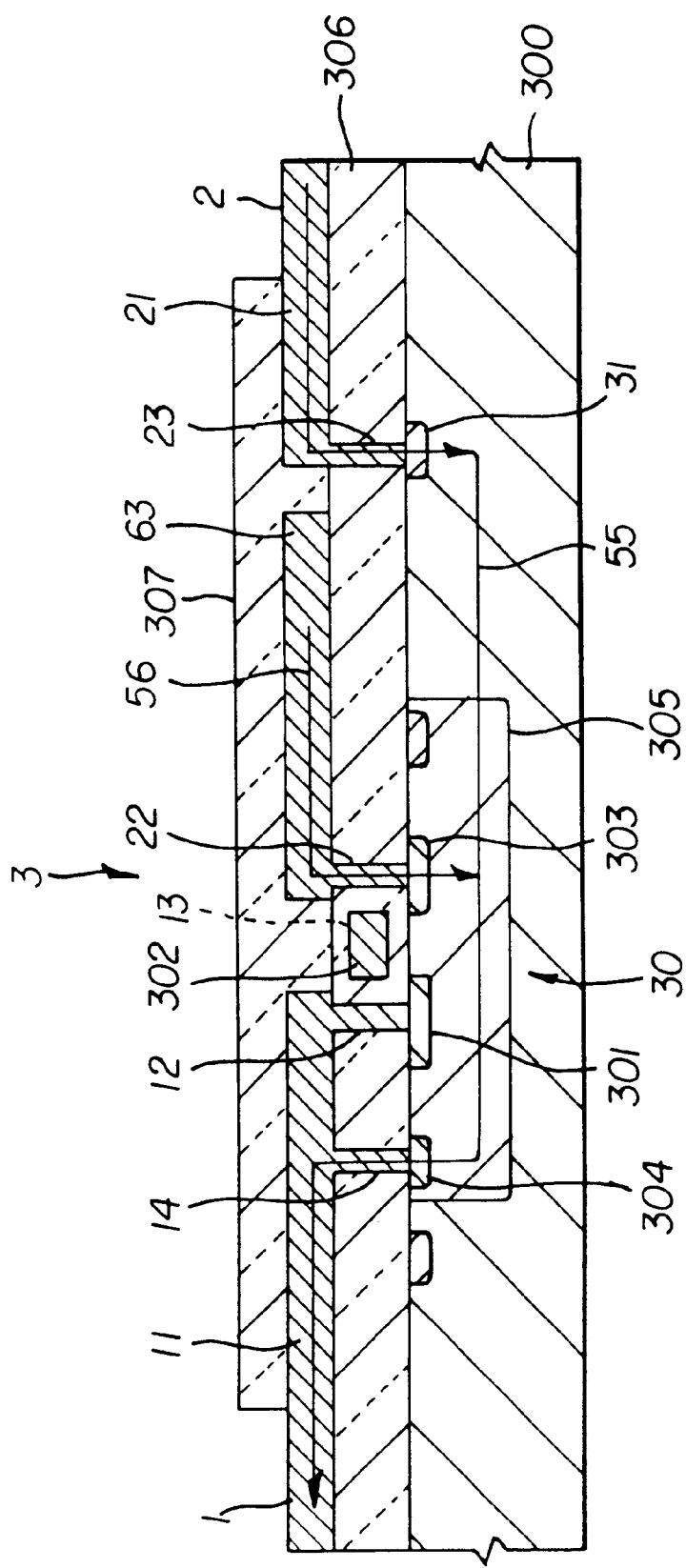
FIG. 8 is a longitudinal sectional view taken along line C—C of FIG. 7.
Figure 9:
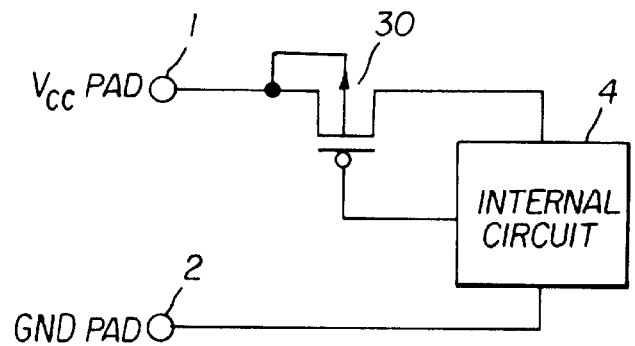
FIG. 9 is a circuit diagram of the semiconductor device in FIG. 7.

Third Embodiment:

FIG. 7 is a plan view showing a principal part of a semiconductor device according to the third embodiment of the present invention, FIG. 8 is a longitudinal sectional view taken along line C—C of FIG. 7, and FIG. 9 is a circuit diagram showing the circuit arrangement of the semiconductor device. The third embodiment is different from the first and second embodiments in that the p MOS transistor 30 constituting the reverse connection protection element is not connected in parallel to the internal circuit 4 between the Vcc pad 1 and the GND pad 2 but is serially inserted into a power supply line which connects the Vcc pad 1 and the internal circuit 4 to each other.

More specifically, in the p MOS transistor 30, the source region 301 is electrically connected to the metal line 11, which is electrically connected to the Vcc pad 1, via the contact portion 12. The n well 305 is electrically connected to the metal line 11 via the n well pickup 304 and the contact portion 14. The gate electrode 302 is electrically connected to a metal line 64, which is connected to the internal circuit 4, via the contact portion 13. The drain region 303 is electrically connected to another metal line 63, which is connected to the internal circuit, via the contact portion 22.

The metal line 63 serves as a power supply line for the internal circuit 4. The p$^+$ guard ring 31 is electrically connected to the metal line 21, which is connected to the GND pad 2, via the contact portion 23.

According to the third embodiment, only the GND pad 2 is electrically connected to the internal circuit 4 via the GND line 62. The other structure of the semiconductor device according to the third embodiment is the same as that of the semiconductor device according to the first embodiment. Therefore, elements and parts of the third embodiment corresponding to those of the first embodiment are denoted by the same reference numerals, and a description thereof is omitted herein. Note that the passivation film 307 is omitted from FIG. 7.

As is the case with the first embodiment, the low impedance region 3 and metal lines 11, 21 are designed such that the current density thereof is equal to or smaller than the allowable value in order to prevent the p MOS transistor 30 from breaking down and prevent the metal lines 11, 21 from being cut even if the current generated during the reverse connection flows extensively into the low impedance region 3.

There will now be described the route of current during reverse connection. As indicated by an arrow in FIG. 8, the reverse connection causes current to flow on a route 55 extending from the GND pad 2 to the Vcc pad 1 via the metal line 21, the p$^+$ guard ring 31, the p substrate 300, the n well 305, the n well pickup 304, and the metal line 11 in this order. The reverse connection also causes current to flow on a route 56 extending from the GND pad 2 to the Vcc pad 1 via the GND line 62, the internal circuit 4, the metal line 63, the drain region 303, the n well 305, the n well pickup 304, and the metal line 11 in this order. The current flowing on the route 56 via the internal circuit 4 is allowed to be neglected since a value of resistance of the low impedance region 3 is sufficiently smaller than a value of resistance of the internal circuit 4.

On this occasion, if a proper voltage is supplied to the Vcc pad 1 and the GND pad 2, the switching of the power supply line can be controlled by turning on and off the p MOS transistor 30. Specifically, the p MOS transistor functions as an overvoltage protection circuit or overcurrent protection circuit that prevents the application of overvoltage or overcurrent to the internal circuit 4. In this case, for example, a circuit that detects overvoltage or overcurrent is provided to control a gate voltage of the p MOS transistor 30.

According to the above-described third embodiment, the low impedance region 3 is comprised of the p MOS transistor 30, and therefore, the low impedance region 3 can be fabricated by the CMOS fabrication process. This eliminates the necessity of a special ion implantation process required for producing a bipolar transistor and thus makes it possible to fabricate a CMOS integrated circuit including a reverse connection protection circuit at a low cost.

Figure 10:
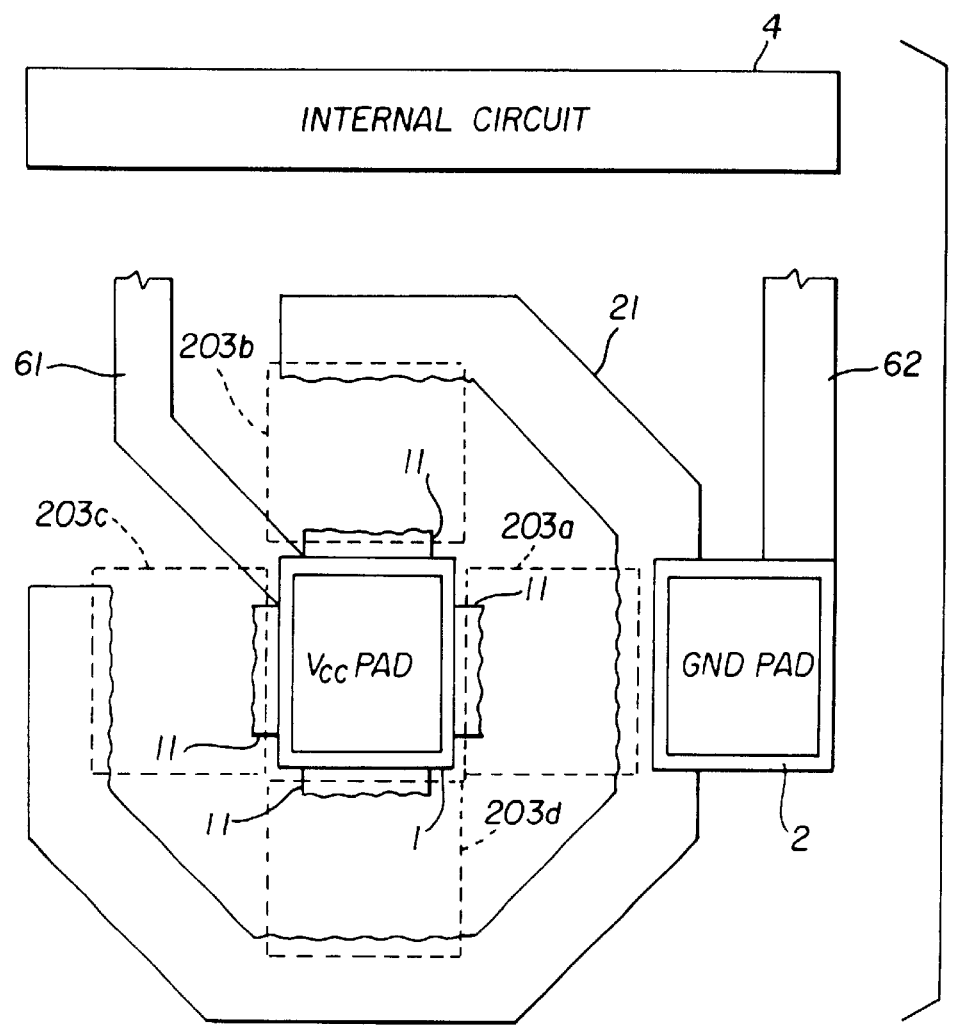
FIG. 10 is a plan view showing a principal part of a semiconductor device according to the fourth embodiment of the present invention.

Fourth Embodiment:

FIG. 10 is a plan view showing a principal part of a semiconductor device according to the fourth embodiment of the present invention. According to the fourth embodiment, four low impedance regions 203a, 203b, 203c, 203d that provide low impedance during reverse connection are disposed around the Vcc pad 1 that is rectangular or substantially rectangular, and the four low impedance regions 203a to 203d are connected to each other through the metal line 21. This arrangement reduces the current density during the reverse connection, and makes it possible to efficiently disperse the route of current during the reverse connection. The structure of the low impedance regions 203a to 203d is the same as that of the low impedance region 3 according to the first embodiment or low impedance region 103 according to the second embodiment. Note that a passivation film is omitted from FIG. 10.

Further, as is the case with the third embodiment, respective ones of p MOS transistors (not illustrated) constituting the low impedance regions 203a to 203d may be serially inserted into a power supply line. Further, two or three or more low impedance regions may be provided, and for example, respective ones of low impedance regions may be disposed in several directions around the Vcc pad 1.

According to the above-described fourth embodiment, the low impedance regions 203a to 203d are comprised of the p MOS transistors or Zener diodes that are fabricated by the CMOS fabrication process, and therefore, the low impedance regions 203a to 203d can be fabricated by the CMOS fabrication process. This eliminates the necessity of a special ion implantation process required for producing a bipolar transistor and thus makes it possible to fabricate a CMOS integrated circuit including a reverse connection protection circuit at a low cost. Further, according to the fourth embodiment, the route of current is efficiently dispersed during the reverse connection, and the density of current flowing into the respective ones of the low impedance regions 203a to 203d is lowered to improve the capability to withstand breakdown of the protection circuit.

Figure 11:
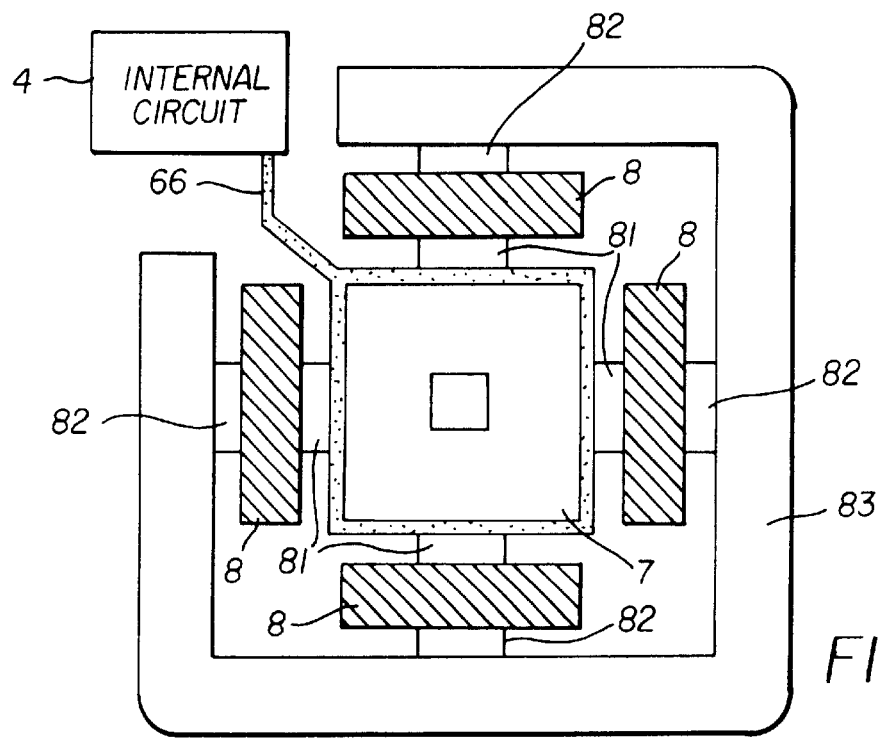
FIG. 11 is a plan view showing a principal part of a semiconductor device according to the fifth embodiment of the present invention.

Fifth Embodiment:

FIG. 11 is a plan view showing a principal part of a semiconductor device according to the fifth embodiment of the present invention. According to the fifth embodiment, respective ones of four surge protection elements 8 are disposed around and in proximity to four sides of a square or substantially square pad 7. One electrodes of the pad 7 and respective protection elements 8 are electrically connected to each other through a first line 81, and the other electrodes of the respective surge protection elements 8 are electrically connected to a third line 83, which lets off surge current of power supply voltage or ground potential, through a second line 82. The potential of the pad 7 is supplied to the internal circuit 4 through a line 66.

Examples of the surge protection elements 8 are Zener diodes, PMOS diodes, and NMOS diodes. It is preferred that the respective ones of the surge protection elements 8 have the same structure so as to uniformly disperse surge current. If the surge protection elements 8 are pull-up Zener diodes or pull-up PMOS diodes, the third line 83 is a power supply line that supplies power supply voltage. If the surge protection elements 8 are pull-down Zener diodes or pull-down NMOS diodes, the third line 83 is a ground line. It is preferred that the first line 81, the second line 82, and the third line 83 are metal lines having a small wiring resistance. It is also preferred that the first line 81 and the second line 82 have the same wiring width. It is further preferred that the third line 83 is four times as wide as the first line 81 and the density of surge current flowing through the pad 7 and the density of current flowing through the third line 83 are equal.

Figure 12:
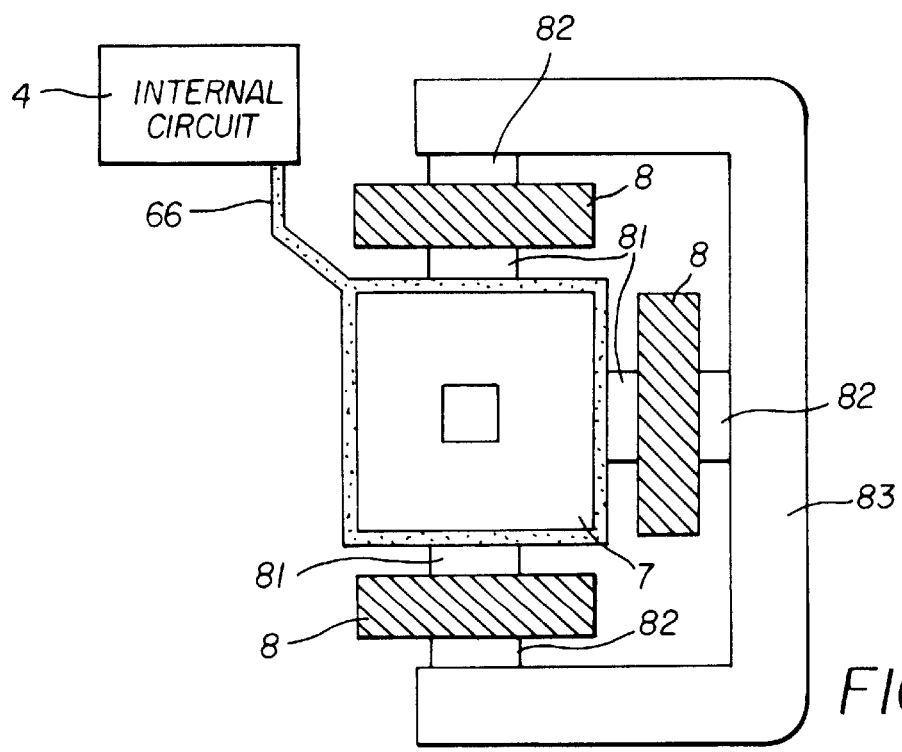
FIG. 12 is a plan view showing a principal part of a variation of the semiconductor device according to the fifth embodiment of the present invention.
Figure 13:
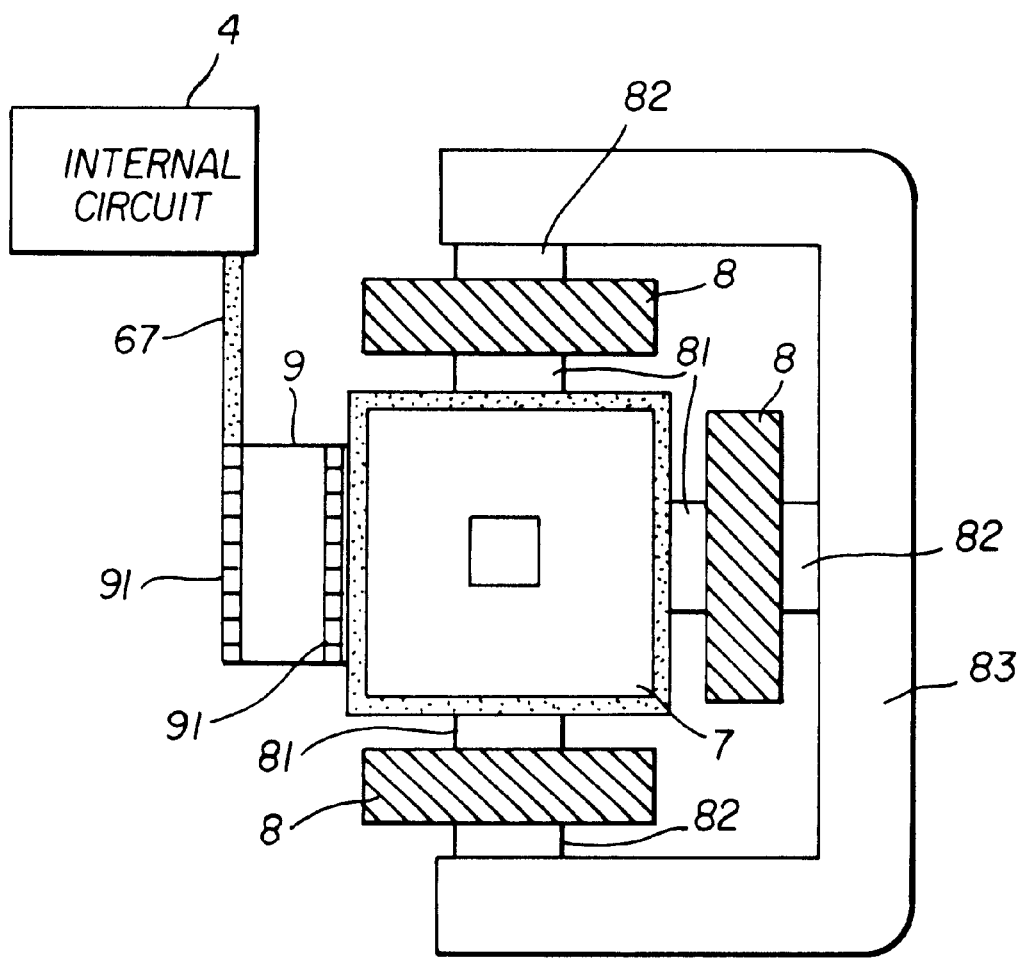
FIG. 13 is a plan view showing a principal part of the semiconductor device of FIG. 12, to which is added a polysilicon restriction resistance for dealing with electrostatic discharge (ESD).

Further, as shown in FIG. 12, respective ones of total three surge protection elements 8 may be disposed in proximity to three of four sides of the pad 7. In this case, it is preferred that the third line 83 is three times as wide as the first line 81 so that the density of surge current flowing through the pad 7 and the density of current flowing through the third line 83 can be equal. Further, as shown in FIG. 13, respective ones of total three surge protection elements 8 may be disposed in proximity to three of four sides of the pad 7, and a wide limit resister 9 made of polysilicon for example may be disposed in the remaining one side of the pad 7 for the purpose of protecting the pad 7 from electro-static discharge (ESD). The limit resister 9 is electrically connected to the pad 7 and a metal line 67, which is connected to the internal circuit 4, via a contact portion 91.

According to the above-described fifth embodiment, surge current applied to the pad 7 is dispersed into the three or four surge protection elements 8, and this lowers the density of current flowing through the lines 81 between the pad 7 and the surge protection elements 8 and reduces the concentration of electric fields between the pad peripheral circuit elements and the line 81 to improve the capability to withstand surge breakdown. This suppresses electromigration of the line 81, insulation breakdown of peripheral circuit elements or peripheral lines, and the like. It is therefore possible to obtain a CMOS integrated circuit that includes a protection circuit having a higher capability to withstand surges as compared with the prior art.

It should be understood, however, that there is no intention to limit the invention to the above-described embodiments, but on the contrary, the invention is to cover all modifications, alternate constructions and equivalents. For example, although in the first, second, third, and fourth embodiments, the transistor or diode is fabricated in the N type well formed on the P type semiconductor substrate, a transistor or diode may be fabricated directly on an N type semiconductor substrate.

According to the present invention, the low impedance region is fabricated by the CMOS fabrication process, and this eliminates the necessity of a special ion implantation process required for producing a bipolar transistor. Therefore, a CMOS integrated circuit which includes a reverse connection protection circuit can be fabricated at a low cost.

Further, according to the present invention, surge current applied to the pad is dispersed to three or four surge protection elements. This lowers the density of current flowing through lines between the pad and the surge protection elements and reduces the concentration of electric fields between the pad peripheral circuit elements and the lines. It is therefore possible to realize a CMOS integrated circuit that includes a protection circuit having a higher capability to withstand surge breakdown as compared with the prior art.

What is claimed is:

1. A semiconductor device comprising:
    a Vcc pad to which is supplied a power supply voltage;
    a GND pad to which is supplied a ground potential;
    a low impedance region that is formed by a complimentary metal-oxide semiconductor fabrication process and is designed such that an impedance thereof becomes lowest in a circuit when the ground potential and the power supply voltage are supplied to said Vcc pad and said GND pad, respectively;
    a first metal line that electrically connects said low impedance region to said Vcc pad; and
    a second metal line that electrically connects said low impedance region with said GND pad.

2. A semiconductor device according to claim 1, wherein two or more said low impedance regions are provided around said Vcc pad and in proximity to said Vcc pad.

3. A semiconductor device according to claim 2, wherein four said low impedance regions are provided around said Vcc pad that is rectangular or substantially rectangular.

4. A semiconductor device according to claim 1, wherein said impedance region comprises:
    a P type metal-oxide semiconductor transistor in which a source region, gate region, and n well are electrically connected to said Vcc pad and a drain region is electrically connected to said GND pad; and
    a guard ring that is comprised of a P type semiconductor provided around said metal-oxide semiconductor transistor and is electrically connected to said GND pad.

5. A semiconductor device according to claim 1, wherein said low impedance region comprises:
    a P type metal-oxide semiconductor transistor in which a source region, gate electrode and N type semiconductor substrate are electrically connected to said Vcc pad, and a drain region is electrically connected to said GND pad; and
    a guard ring that is comprised of a P type semiconductor provided around said metal-oxide semiconductor transistor and is electrically connected to said GND pad.

6. A semiconductor device according to claim 1, wherein said low impedance region comprises:
    a P type metal-oxide semiconductor transistor in which a source region and an n well are electrically connected to said Vcc pad, and a gate electrode and a drain region are electrically connected to said GND pad; and
    a guard ring that is comprised of a P type semiconductor provided around said metal-oxide semiconductor transistor and is electrically connected to said GND pad.

7. A semiconductor device according to claim 1, wherein said low impedance region comprises:
    a P type metal-oxide semiconductor transistor in which a source region and an N type semiconductor substrate are electrically connected to said Vcc pad, and a gate electrode and a drain region are electrically connected to said GND pad; and
    a guard ring that is comprised of a P type semiconductor provided around said MOS transistor and is electrically connected to said GND pad.

8. A semiconductor device according to claim 1, wherein said low impedance region comprises:
    a Zener diode in which a cathode region is electrically connected to said Vcc pad, and an anode region is electrically connected to said GND pad; and
    a guard ring that is comprised of a P type semiconductor provided around said Zener diode and is electrically connected to said GND pad.

9. A semiconductor device according to claim 4, wherein:
    said first metal line and said second metal line have such a wiring width as to prevent electro-migration from occurring due to current flowing into said low impedance region when the ground potential and the power supply voltage are supplied to said Vcc pad and said GND pad.

10. A semiconductor device according to claim 5, wherein:
    said first metal line and said second metal line have such a wiring width as to prevent electro-migration from occurring due to current flowing into said low impedance region when the ground potential and the power supply voltage are supplied to said Vcc pad and said GND pad.

11. A semiconductor device according to claim 4, wherein said P type metal-oxide semiconductor transistor serves as a surge protection element that utilizes punch-through characteristics of the source region and the drain region when the power supply voltage and the ground potential are supplied to said Vcc pad and said GND pad, respectively.

12. A semiconductor device according to claim 5, wherein said P type metal-oxide semiconductor transistor serves as a surge protection element that utilizes punch-through characteristics of the source region and the drain region when the power supply voltage and the ground potential are supplied to said Vcc pad and said GND pad, respectively.

13. A semiconductor device according to claim 8, wherein said Zener diode serves as a surge protection element that utilizes reverse breakdown when the power supply voltage and the ground potential are supplied to said Vcc pad and said GND pad, respectively.

14. A semiconductor device, wherein surge protection elements with identical characteristics disposed in proximity to four sides of a rectangular or substantially rectangular pad; and wherein each side of the pad and the surge protection element corresponding thereto are electrically connected to each other.

15. A semiconductor device comprising:

surge protection elements with identical characteristics disposed in proximity to three sides of a rectangular or substantially rectangular pad;

wherein each side of the pad and the surge protection element corresponding thereto are electrically connected to each other.

16. A semiconductor device according to claim 15, wherein a limit resistor for dealing with electrostatic discharge is connected between the other sides of the pad and an internal circuit.

17. A semiconductor device according to claim 14, wherein said surge protection elements are Zener diodes, P type metal-oxide semiconductor diodes, or N type metal-oxide semiconductor diodes.

18. A semiconductor device according to claim 15, wherein said surge protection elements are Zener diodes, P type metal-oxide semiconductor diodes, or N type metal-oxide semiconductor diodes.

* * * * *

UNITED STATES PATENT AND TRADEMARK OFFICE
CERTIFICATE OF CORRECTION

PATENT NO. : 6,680,512 B2 Page 1 of 1
APPLICATION NO. : 10/121447
DATED : January 20, 2004
INVENTOR(S) : Mutsuo Nishikawa, Katsumichi Ueyanagi and Katsuyuki Uematsu It is certified that error appears in the above-identified patent and that said Letters Patent is hereby corrected as shown below:

In Column 10, Line 23, the phrase "are electronically connected to said GND pad" should be corrected to read as:

--are electronically connected to an internal circuit--

In Column 10, Line 32-33, the phrase "are electronically connected to said GND pad" should be corrected to read as:

--are electronically connected to an internal circuit--

Signed and Sealed this

Twenty-third Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 6,680,512 B2
APPLICATION NO. : 10/121447
DATED : January 20, 2004
INVENTOR(S) : Mutsuo Nishikawa, Katsumichi Ueyanagi and Katsuyuki Uematsu It is certified that error appears in the above-identified patent and that said Letters Patent is hereby corrected as shown below:

In Column 10, Line 23, the phrase "are electrically connected to said GND pad" should be corrected to read as:

--are electrically connected to an internal circuit--

In Column 10, Lines 32-33, the phrase "are electrically connected to said GND pad" should be corrected to read as:

--are electrically connected to an internal circuit--

This certificate supersedes the Certificate of Correction issued October 23, 2007.

Signed and Sealed this

Fifth Day of February, 2008

JON W. DUDAS
*Director of the United States Patent and Trademark Office*